United States Patent [19]

Kinnard et al.

[11] Patent Number: 4,987,295

[45] Date of Patent: Jan. 22, 1991

[54] MULTICHIP IMAGER WITH IMPROVED OPTICAL PERFORMANCE NEAR THE BUTT REGION

[75] Inventors: Kenneth P. Kinnard, Moorestown; Richard T. Strong, Jr., Medford; Samuel Goldfarb, Princeton; John R. Tower, Medford, all of N.J.

[73] Assignee: General Electric Company, Moorestown, N.J.

[21] Appl. No.: 331,137

[22] Filed: Mar. 31, 1989

[51] Int. Cl.$^5$ .............................................. H01J 40/14
[52] U.S. Cl. ..................................... 250/208.1; 357/75
[58] Field of Search ................ 250/208.1; 358/213.15, 358/213.17, 213.27; 357/75

[56] References Cited

U.S. PATENT DOCUMENTS

| | | | |
|---|---|---|---|
| 4,145,721 | 3/1979 | Beaudouin | 358/213.15 |
| 4,237,488 | 12/1980 | Takemura | 358/213.7 |
| 4,481,539 | 11/1984 | Meise et al. | 358/213.17 |
| 4,811,082 | 3/1989 | Jacobs et al. | 357/75 |
| 4,907,062 | 3/1990 | Fukushima | 357/75 |

OTHER PUBLICATIONS

"Improved Optical Performance near the Butt Regions of Multichip Focal Planes", by Strong et al., Published at pp. 36–41, vol. 924 of the Proceedings of the SPIE, 6–8 Apr. 1988.

*Primary Examiner*—David C. Nelms
*Assistant Examiner*—Stephone B. Allen
*Attorney, Agent, or Firm*—William H. Meise

[57] ABSTRACT

A compound imager consists of two or more individual chips, each with at least one line array of sensors thereupon. Each chip has a glass support plate attached to the side from which light reaches the line arrays. The chips are butted together end-to-end to make large line arrays of sensors. Because of imperfections in cutting, the butted surfaces define a gap. Light entering in the region of the gap is either lost or falls on an individual imager other than the one for which it is intended. This results in vignetting and/or crosstalk near the butted region. The gap is filled with an epoxy resin or other similar material which, when hardened, has an index of referaction near that of the glass support plate.

9 Claims, 9 Drawing Sheets

MULTICHIP IMAGER WITH IMPROVED OPTICAL PERFORMANCE NEAR THE BUTT REGION the invention described herein was made in the performance of work under NASA Contract No. NAS5-27505 and is subject to the provisions of Section 305 of the National Aeronautics and Space Act of 1958, as amended (72 Stat. 2/35; 42 U.S.C. 2457).

BACKGROUND OF THE INVENTION

This invention relates to image sensor arrays assembled from multiple chips. Many modern control and surveillance systems require imagers for forming signals representing scenes viewed by the imager. Tube-type image sensors such as image orthocons have been largely supplanted by solid-state image devices or sensors for these purposes. Common solid-state image devices include the charge-coupled device (CCD) imager, which is gaining widespread acceptance in home television camcorders. Such CCD sensors for home television use consist of rectangular arrays of 200×200, or more, individual light sensors or pixels. CCD arrays are advantageous because of their light weight, ruggedness, low power consumption, relatively great sensitivity to light, and resistance to damage due to light overload. CCD image sensors are also responsive to infrared radiation, and may be used for near-infrared detection or imaging. Cooling improves the infrared operation for some types of detector materials.

The individual light sensor of a CCD sensor array receives light over a certain surface area, and responds to each received photon of light by releasing one or more electrons. The released electrons are integrated during an integration interval to produce individual pixel output signals. The individual sensor output signals are transferred, together with the individual outputs of other similar sensors, to produce the final output signal. The size of the light-receiving area of the individual sensor or pixel, together with the number density of the pixels, is established by the resolution requirements of the imaging system. The sensitivity of the sensors (the minimum light level to which it is desired to respond) is established by the optics of the system, by the integration time, and by the light conversion efficiency of the sensor. Some wavelengths of light are converted into electrons or detected with greater efficiency than other wavelengths. Ordinarily, the individual sensors are roughly square in outline. Such image sensors are described in detail in the text "Charge Transfer Devices" by Se'quin et al., published by Academic Press, Inc. 1975.

Charge transfer devices are manufactured by photolithography, etching and doping in much the same manner as integrated circuits. For a typical individual CCD sensor with dimensions of approximately 60 micrometers ($\mu m$) square, a resolution of 1,000 pixels for the array requires a structure which is 60 millimeters (mm) long. Those skilled in the art of manufacturing integrated circuits know that the yield of integrated circuits as a percentage of the total number manufactured is sharply dependent upon the size of the device, because even a single defect attributable to the errors in the crystalline structure of the silicon substrate may render an integrated circuit unusable. In the context of a solid-state imager, such manufacturing defects show up as artifacts in the image. An entire art has grown up which is directed to schemes for compensating for these errors, as for example U.S. Pat. No. 4,481,539 issued Nov. 6, 1984, in the name of Meise et al, so that imperfect imagers may be used commercially.

At the present state of the art, it is difficult to make imagers in which solid-state imager arrays in which more than about one thousand individual sensors are arrayed in a given direction. Consequently, for applications requiring more elements, as for example five thousand sensors arrayed in a line, it is necessary to juxtapose or butt together multiple imager arrays formed on individual dice. It has been found that the image produced by such a compound imager is imperfect in the region of the butt joint.

SUMMARY OF THE INVENTION

A compound imager includes first and second imager submodules. Each of the imager submodules includes a plate of electromagnetically transparent material having an index of refraction and defining first and second mutually parallel broad surfaces, and also defining at least a first substantially flat third surface orthogonal to the first and second broad surfaces. Each of the imager submodules also includes at least one line array of electromagnetic sensors responsive to electromagnetic radiation for producing signals. The sensor array of each of the submodules is mounted on the first broad surface of the submodule and extends thereon substantially to the third surface. The first and second imager submodules have their third surfaces butted together in such a manner that the sensor array(s) of the first submodule are substantially aligned with those of the second submodule. Because of imperfections in the flatness of the third surfaces of the submodules, the butt region may define a gap. The gap may result in vignetting of or crosstalk among individual sensors lying near the gap. The compound imager further includes a hardenable liquid which substantially completely fills the gap. The hardenable liquid, when hardened, has an index of refraction near the index of refraction of the plate of electromagnetically transparent material for reducing the vignetting and crosstalk.

DESCRIPTION OF THE INVENTION

Figure 1:
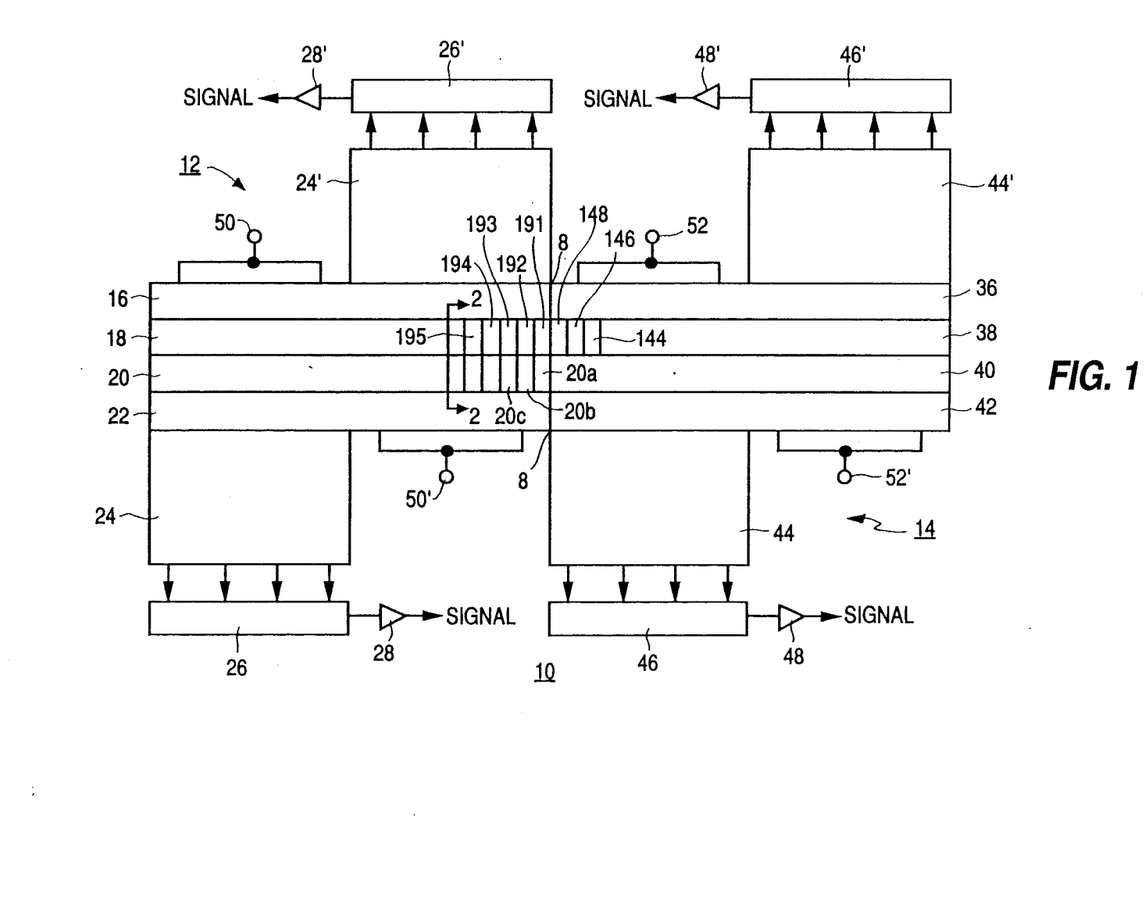
FIG. 1 is a simplified plan view of two imager submodules butted together so as to align their line arrays.

In FIG. 1, a compound imager designated generally as 10 includes a first imager submodule or chip 12 and a second imager submodule 14, which are butted together or juxtaposed along a surface 8. Imager submodule 12 includes first, second, third and fourth line arrays illustrated as regions 16, 18, 20 and 22, respectively. Each line array includes a plurality of individual sensors. Three such individual sensors designated 20a, 20b and 20c are illustrated within line array 20, and five other sensors designated 191, 192, 193, 194 and 195 are illustrated in conjunction with line array 18. A two-section storage register including regions 24 and 24' is included for temporary storage of signals produced by line arrays 16–22 (Where the hyphen represents the word "through"). From storage register regions 24 and 24', the signals are coupled to the two storage regions 26, 26' of a two section output register, from which they are sequentially read from to output amplifiers 28 and 28', all in accordance with conventional CCD imager operation.

Imager submodule 14 similarly includes line array regions 36, 38, 40 and 42 which are coaxially aligned with line array regions 16, 18, 20 and 22, respectively. As described below in conjunction with FIG. 2, optical filters associated with the imagers of the line arrays make the sensors of line arrays 16 and 36 responsive to red light, 18 and 38 responsive to green light, 20 and 40 responsive to blue light, and 22 and 42 responsive to near-infrared (NIR) radiation. Imager submodule 14 also includes a storage register illustrated as regions 44 and 44' which accept signals from regions 36, 38, 40 and 42 for temporary storage, and which transfer the signals to portions 46, 46' of an output register, respectively. From output register portions 46 and 46', the signals for each line are transferred sequentially to output amplifiers 48 and 48', respectively. Drain pairs 50, 50', and 52, 52' may be coupled to the sensing regions of imager submodules 12 and 14, respectively, for reducing blooming in known manner.

Figure 2:
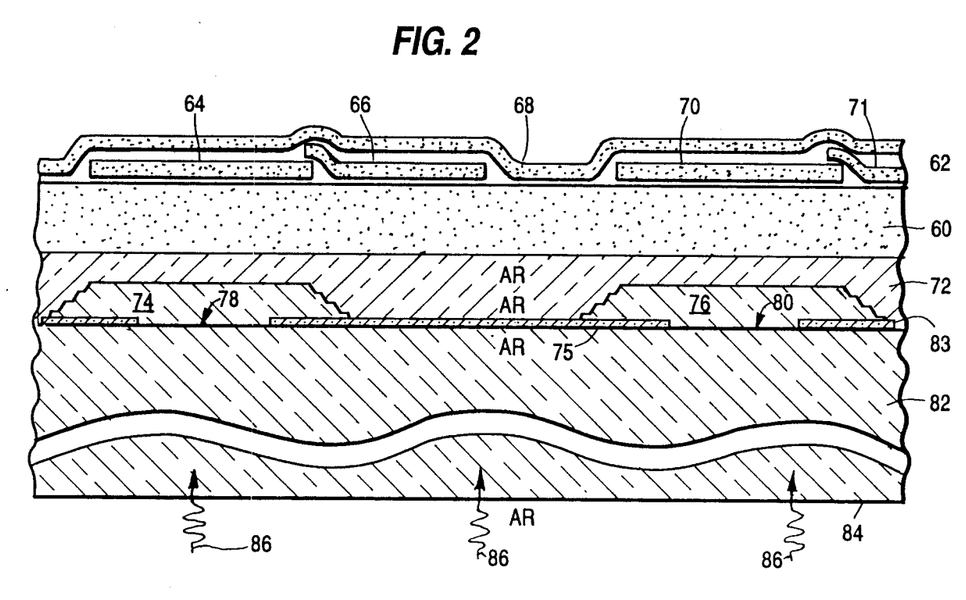
FIG. 2 is an elevation cross-section of a portion of one of the imager submodules of FIG. 1.

FIG. 2 is a cross-section of a portion of imager submodule 12 taken along section lines 2—2 in FIG. 1. In FIG. 2, a semiconductor substrate 60 which may be silicon includes a plurality of polysilicon gates on one side in a region designated 62. These include a storage gate 64, a transfer gate 66 and a second transfer gate 68. Another storage gate illustrated as 70 begins a new cycle, which includes a further transfer gate, a portion of which is illustrated as 71. Silicon substrate 60 is very thin (about 8 $\mu$m) and fragile. A glass support substrate 82 includes a first surface 84 for admitting light illustrated by photon symbols 86. A second surface 83 of glass substrate 82 has formed thereon antireflection coatings designated AR and a mask 75 defining windows illustrated as 78 and 80. Further depositions on surface 83 include transparent regions 74 and 76 which are dimensioned to provide light transmission for green and blue light, respectively. The bottom of silicon substrate 60 with its associated gates is bonded to the upper surface of glass substrate 82 by means of a transparent adhesive filler illustrated as 72. Adhesive filter 82 may be an epoxy. Such structures are well known in the art and require no further explanation.

Figure 3A:
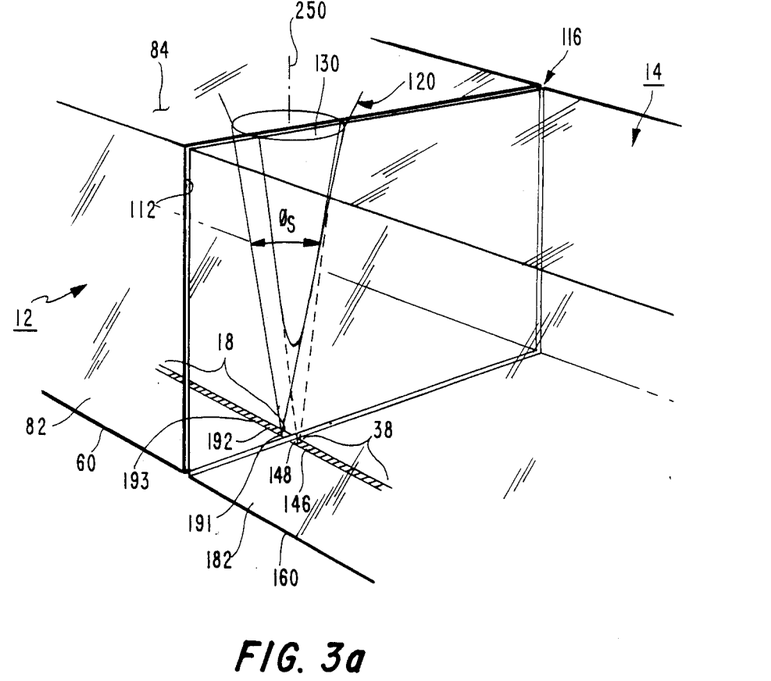
FIGS. 3a and 3b, referred to jointly as FIG. 3, illustrate in perspective or isometric view and in elevation cross-sectional view, respectively, some of the sensors near the gap region between two butted imager submodules, illustrating light paths which result in crosstalk.
Figure 3B:
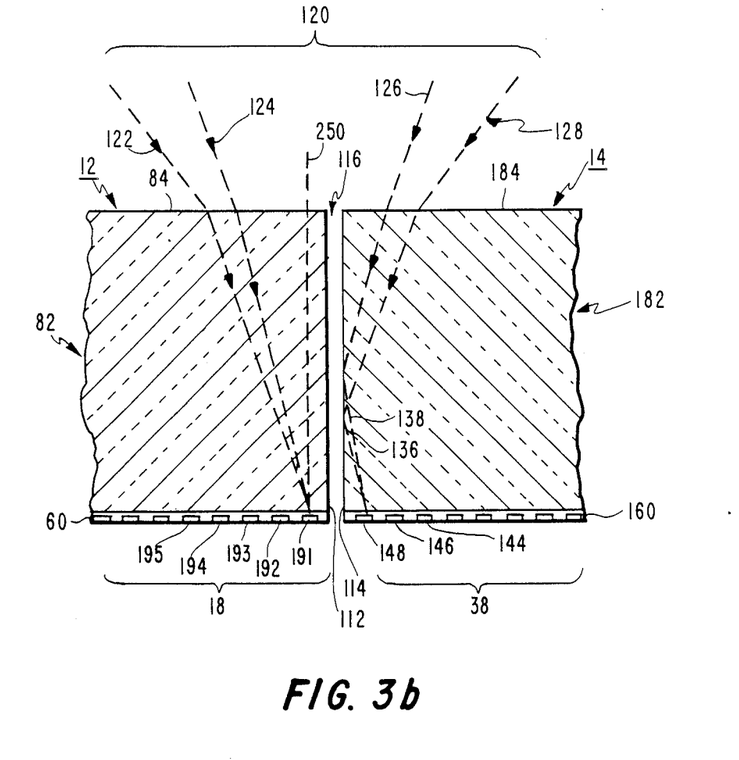

FIGS. 3a and 3b are phantom perspective or isometric views and cross-sectional views, respectively, of the butt regions between two imagers such as described in conjunction with FIG. 1. FIGS. 3a and 3b illustrate line arrays and light paths associated with a cone of light focused on certain imagers, in order to explain how cross-talk and vignetting take place. Elements of FIG. 3 corresponding to those of FIGS. 1 and 2 are designated by the same reference numerals. In FIGS. 3a and 3b, but more visible in FIG. 3b, glass substrate 82 of imager submodule 12 is illustrated as having its end surface 112 spaced by a gap 116 from the corresponding end face 114 of glass substrate 182 of imager submodule 14. The gap may occur as a result of misalignment of the chips, or it may result from imperfect flatness of butting surfaces 112 and 114. Also illustrated in FIG. 3 is silicon substrate 60 of imager submodule 12 bonded to the lower surface of glass substrate 82, and corresponding silicon substrate 160 of imager submodule 14, bonded to its glass substrate 182. In general, the thickness of silicon substrates 60 and 160 is so thin relative to the thickness of glass substrates 82 and 182 that their effect on the light paths is minimal. Consequently, the effects of the presence of silicon substrates 60 and 160 are ignored in the following explanation.

When a scene (not illustrated) to be imaged is focused by a lens (not illustrated) onto line arrays 18 and 38, the smallest feature of the image which can be discerned is one which is focused upon only one imager. The lens (not illustrated) may be considered to form a cone of light which travels toward the particular image sensor in question. For purposes of explanation, assume that a feature of the scene in question is focused on the last individual image sensor 191 associated with image submodule 12. Image sensor 191 is the last image sensor before end surface 112, and it may be spaced by as little as one half the inter-pixel spacing therefrom. The cone of light impinging on upper surfaces 84 and 184 of glass substrates 82 and 182, respectively, is illustrated as 120, and is centered on an axis 250 orthogonal to upper surface 84. Individual rays are illustrated in FIG. 3b as 122, 124, 126 and 128.

As illustrated in FIG. 3, a portion of the cone of light enters upper surface 84 of glass substrate 82, is refracted and proceeds to illuminate individual sensor 191. Certain rays which are illustrated in FIG. 3b as rays 126 and 128 enter upper surface 14 of glass substrate 182. These rays do not, however, contribute to the illumination of sensor 191 since they undergo internal reflection upon striking surface 114 due to the difference in the index of refraction between air gap 116 and glass substrate 182. This is illustrated more clearly by light cone portion 130 of FIG. 3a which has the shape of a segment of a cone.

Since rays 126 and 128, which were originally focused onto sensor element 191, are deflected by internal reflection from surface 114, they represent a loss in illumination for sensor element 191. This loss is known as vignetting. Since, also, these reflected rays 136 and 138 will strike other sensor elements such as sensor element 148 as illustrated in FIG. 3b, the resulting unintended illumination produces a form of distortion in the image created from the signals generated by the compound imager, which form of distortion is known as crosstalk.

If end surfaces 112 and 114 were completely flat and if the width of the gap were known exactly, the exact amount of crosstalk and vignetting could be calculated. However, the end faces are not completely flat, and the gap spacing therefore varies, as does the angle of incidence of the rays upon the end surfaces. Consequently, calculation of the exact amount of distortion is not possible. Certain assumptions can be made for theoretical purposes. The angle subtended by a cone of rays is illustrated by $\phi_s$ in FIG. 3a. This angle depends upon the f/number (f#) of the optical system (not illustrated) and the index of refraction ($n_1$) of the glass substrate. Angle $\phi_s$ is given by the expression:

$$\phi_s = 2\sin^{-1}(1/(n_1\sqrt{(1+(2f\#)^2)})) \qquad (1)$$

If the assumed f/number is 3 and $n_1 = 1.51$, $\phi_s = 12.5°$. If no attempt is made to match the index of refraction of the gap with that of the substrate material, then rays impinging on the gap boundary will be reflected as described above. For the case in which the glass substrate has an index of refraction $n_1$ equal to 1.51, total internal reflection will occur for those rays of cone 120 of FIG. 3 whose angle of incidence on end surface 112 is greater than 41.5°. This corresponds to rays in cone 120 of FIG. 3 which have angles with respect to the center line 250 of the cone of light of less than 48.5°. In the case described above in which f/number=3 and $n_1 = 1.51$, all rays entering the gap are totally reflected. If the substrate material is very thin, or if the f/number is very large, no part of the cone of light will intercept the boundary, and optical crosstalk and vignetting will not occur.

Figure 4:
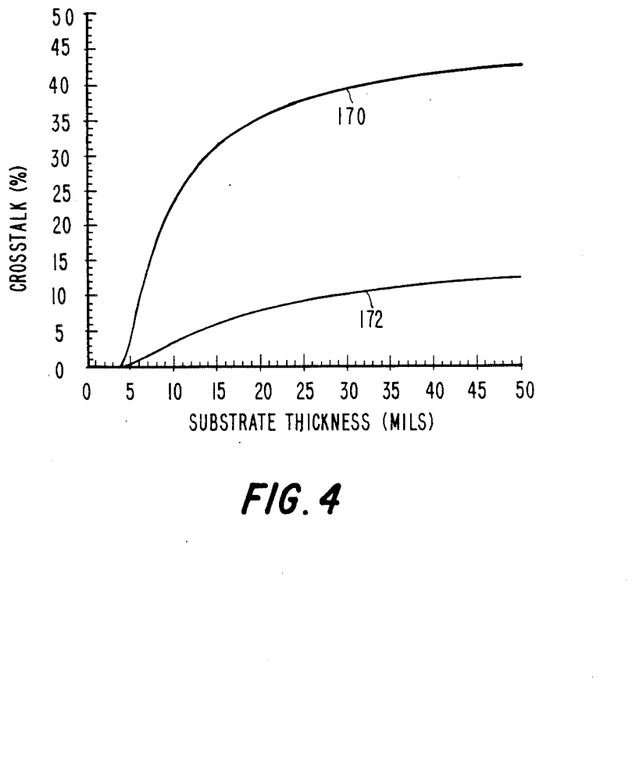
FIG. 4 is a plot of crosstalk versus substrate thickness, with the index of refraction of the gap material as a parameter.

FIG. 4 plots crosstalk in percent versus glass substrate thickness for a system with f/number of 3, $n_1$ of the glass equal to 1.51, and for a distance of 11.5 microns between the last individual image sensor element (191 of FIGS. 1 or 3) and the end face (112 of FIG. 3). In FIG. 4, plot 170 represents the crosstalk when the index of refraction $n_2$ of the gap is 1.0 because the gap is unfilled (contains only air). The crosstalk is very low for substrate thicknesses below about 10 mils. However, a glass substrate of that thickness may be too fragile to be useful in supporting the associated silicon substrate. Sturdier glass substrates having a thickness of greater than 20 mils have crosstalk which is generally greater than 35 percent. Such crosstalk may be undesirable, as mentioned.

According to the invention, gap 116 between butted faces 112 and 114 as illustrated in FIG. 3 is filled with a material having an index of refraction $n_2$ equal to or closely approximating the index of refraction of the glass. This is accomplished by wicking a liquid such as epoxy into the gap, and allowing the epoxy to harden, as described in more detail below. Plot 172 of FIG. 4 is a plot of theoretical crosstalk for the same conditions as plot 170, but with the gap filled with an epoxy having $n_2 = 1.52$. The improvement in crosstalk is evident.

Figure 5A:
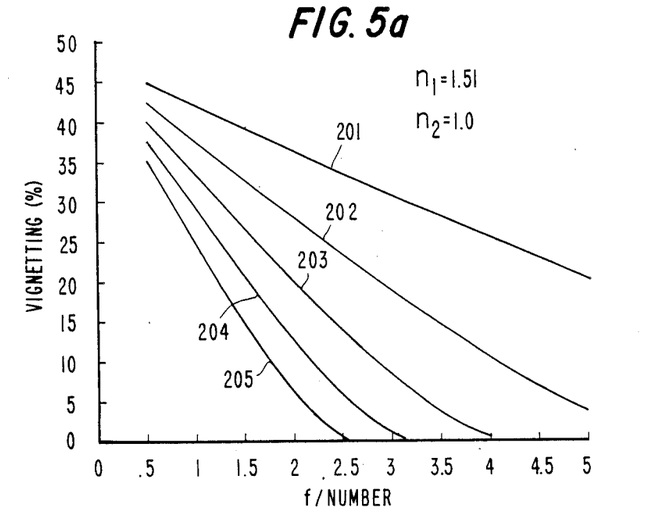
FIG. 5a is a plot of vignetting versus f/number for certain individual sensors lying near an unfilled gap.

FIG. 5a provides an illustrative example of vignetting (in percent) versus the f/number of an imaging lens. The calculations used to produce the curves in FIG. 5a assumed a glass substrate having an index of refraction of 1.51 and a thickness of 635 microns, a sensor element width of 12 microns, a gap width of 10 microns and a sensor element 191 to chip edge surface 112 distance of 11.5 microns.

Figure 5B:
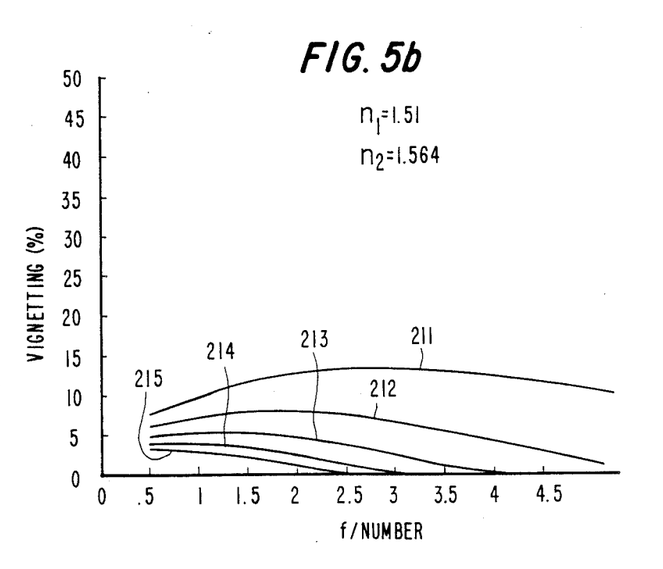
FIG. 5b is a plot of vignetting versus f/number for those sensors lying near a filled gap.

The vignetting plots in FIG. 5a are for the individual sensors or pixels which are the first, second, third, fourth and fifth as measured from the butt face of the imager submodule. Thus, plot 201 corresponds to imager 191 of FIG. 3. Similarly, plot 202 corresponds to individual sensor element 192, 203 corresponds to sensor element 193 and so forth. As can be seen, larger f/numbers tend to reduce vignetting and in particular, for an f/number of 3, plots 204 and 205 show that individual sensor elements 194 and 195 (FIG. 3) are essentially free of vignetting for the particular sensor being analyzed. However, even for an f/number of 3, plots 201-203 show significant levels of vignetting of individual sensors 191, 192 and 193. FIG. 5b is similar to FIG. 5a, except that the gap is filled with a material having an index of refraction of 1.564. As can be seen by comparing FIGS. 5a and 5b, the vignetting for low f/numbers is dramatically improved for all five individual sensor elements near the butt surface.

Figure 6A:
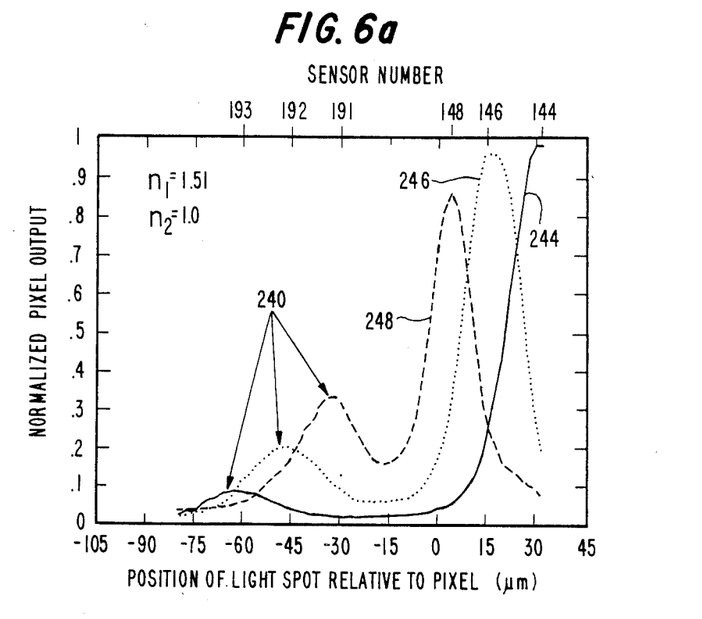
FIGS. 6a and 6b are plots of normalized pixel output versus light spot position for the first three pixels adjacent a gap without and with gap filling material, respectively.

FIG. 6a is a plot of crosstalk for the first three pixels measured from the butt surface, namely pixels 191, 192 and 193 of FIG. 3, plotted against the position of the light spot relative to pixel 191, for the situation in which the glass substrates have an index of refraction of 1.51, and the gap is not filled. The amount of crosstalk illustrated which is attributable to the butt region is significant. Crosstalk peaks are illustrated by points designated 240. In FIG. 6a, an individual sensor element corresponding to 148 of FIG. 3 is located at a position corresponding to reference position zero, and the next adjacent individual sensor element 146 is at about +15 μm. When a NIR light spot is focussed onto individual sensor 148 (i.e., is at position 0) the normalized response of sensor 148 should ideally be 1.0. However, as illustrated by plot 248, the response of sensor 148 is about 0.85, as a result of vignetting. When the light spot is focussed directly onto individual sensor 146 at position +15 μm, plot 246 indicates that the normalized response of sensor 146 is about 0.95, thereby indicating that the vignetting is not as severe for sensor 146 as for sensor 148, because of its distance from the butt region. The response of sensor 144 is even better when the light beam is focussed thereon, as the peak value of plot 244, at position +30 μm, is about 0.98.

When the light beam is focussed onto the position (−30 μm) at which individual sensor 191 is located, crosstalk occurs which creates responses of about 0.35 normalized magnitude (−4.6 dB) from sensor 148 as indicated by peak 240 in plot 248 of FIG. 6a, 0.1 normalized magnitude (−10 dB) from sensor 146 as indicated by plot 246, and essentially zero normalized magnitude from sensor 144, as indicated by plot 244. When the light beam is focussed onto the position (−45 μm) at which individual sensor 192 is located, crosstalk is at a maximum value of about 0.2 normalized magnitude (−7 dB) into sensor 146, as indicated by peak 240 of plot 246. When the light beam is focussed onto sensor 192, the crosstalk to sensor 148 is somewhat less, about 0.13 magnitude (−8.8 dB) as indicated by plot 248, and the crosstalk into sensor 144 is about 0.05 (−13 dB), as indicated by plot 244. FIG. 6a indicates, therefore, that the crosstalk from sensors 191 through 193 into sensors 144 through 148 can be as much as about 35% when the gap is not filled, and the crosstalk decreases in amplitude with increasing distance of the light spot from the butt region and with increasing distance of the affected sensor from the butt region.

Figure 6B:
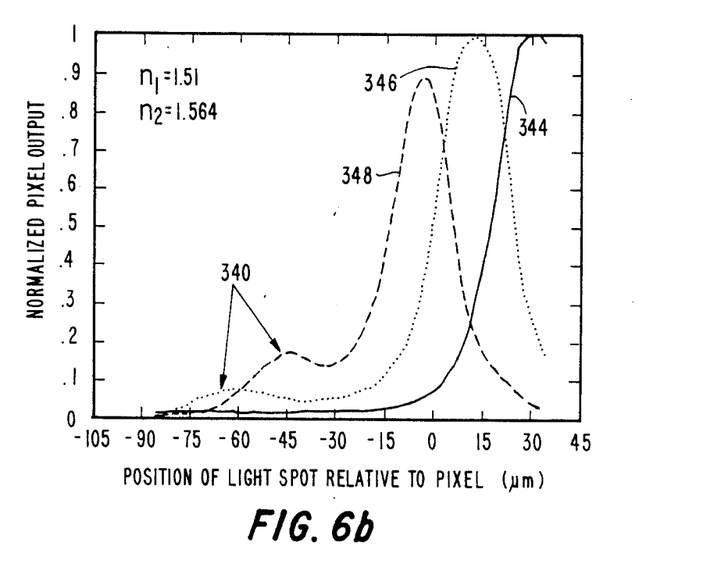

FIG. 6b illustrates plots corresponding to those of FIG. 6a, but for the case in which the index of refraction $n_2$ of the material filling the gap is 1.564. In FIG. 6b, elements corresponding to those of FIG. 6a are designated by the same reference numbers in the 300 series rather than in the 200 series. Thus, plot 346 represents the response of individual sensor 146 of FIG. 3 for the case of a filler in gap 116, just as plot 246 represents the same response with air in the gap. In FIG. 6b, plot 346 shows a normalized peak response at about +14 μm of 1.0, thereby indicating a lack of vignetting. The peak response of plot 348 is about 0.89 (−0.5 dB), which is somewhat better than the 0.87 of plot 248 of FIG. 6a. The crosstalk represented in FIG. 6b is much better than that represented by FIG. 6a. In particular, the maximum crosstalk peak 340 occurs at −45 μm, and is only 0.17 (−7.7 dB), an improvement of about 3 dB over the crosstalk peak 240 value in FIG. 6a.

Figure 7A:
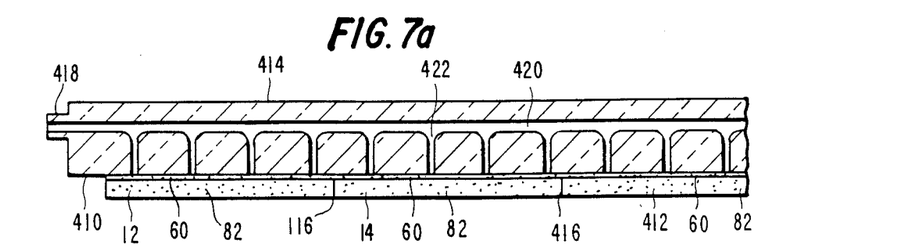
FIGS. 7a, 7b, 7c and 7d, referred to jointly as FIG. 7, represent steps in the manufacture of a compound imager.

FIGS. 7a–7d illustrate steps in making a composite imager. Elements of FIG. 7 corresponding to those of FIGS. 1–3 are designated by the same reference numerals. In FIG. 7a, imager chips 12, 14 and 412 are butted together to define gap regions 116 and 416. The imager chips lie against an optically flat lower surface 410 of a transparent glass assembly plate 414. Assembly plate 414 includes a nipple 418 adapted to be coupled to a vacuum source. Nipple 418 communicates with a plenum or manifold 420 within assembly plate 414. Plenum 420 communicates by way of a plurality of apertures, one of which is designated 422, with lower surface 410. Vacuum applied to nipple 418 and communicated to apertures 422 holds the separate imager chips 12, 14 and 412 firmly against flat lower surface 410 while the chips are aligned.

One or more straight lines are scribed into lower surface 410 of assembly plate 414. Each imager chip is mounted on surface 410 with its silicon portion 60 adjacent lower side 410. The line or lines of individual image sensors of each imager clip can then be aligned with the scribed straight line, whereupon all the imager sensors lie in a straight line. A microscope may be used as necessary to facilitate the alignment, and the scribed line on surface 410 may be viewed through alignment plate 414, as it is transparent.

Figure 7B:
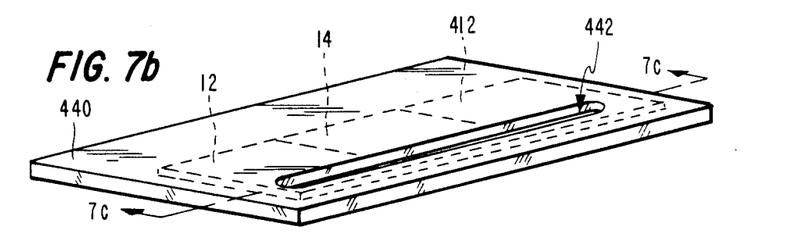

FIG. 7b illustrates a baseplate 440 defining an elongated through slot 442. Slot 442 is a window through which light will reach the line arrays of sensors when assembly is complete. Baseplate 440 may be made from beryllium oxide (BeO) or other thermal conductor. The locations of imager chips 12, 14 and 412 when assembly is complete are indicated by phantom lines. Once the alignment described in conjunction with FIG. 7a is complete, a layer of epoxy resin is spread over that portion of the surface of baseplate 440 which will be in contact with the imager chips.

With the vacuum applied to nipple 418 of FIG. 4a, and imager chips 12, 14 and 412 held firmly in their aligned positions, the lower glass sides of imager chips 12, 14 and 412 are brought into contact with the uncured epoxy on the upper surface of baseplate 440 of FIG. 7b. The vacuum is maintained until the epoxy has cured. When the epoxy has cured, the vacuum is disconnected and assembly plate 414 is removed.

Figure 7C:
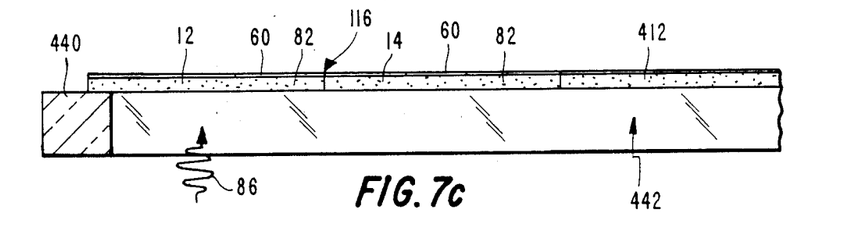

FIG. 7c illustrates a cross-section of baseplate 440 of FIG. 7b through slot 442 taken in the direction of section lines 7c–7c of FIG. 7b, with imager chips 12, 14 and 412 assembled to the baseplate. The direction from which light is received is indicated by a photon symbol 86.

Figure 7D:
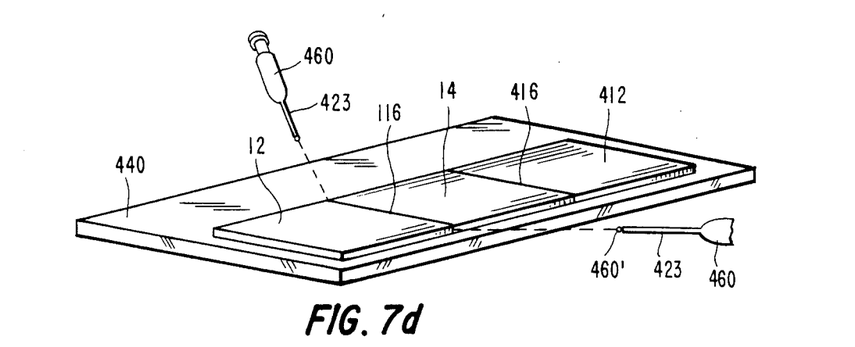

The last step involves wicking liquid epoxy into the gaps, such as gap 116 between imager chips 12 and 14. FIG. 7d represents this step. FIG. 7d illustrates the assembly of baseplate 440 with imager chips 12, 14 and 412. Manufacture of the compound imager includes the use of a syringe designated 460 with a No. 23 hypodermic needle designated 423 which has been squared off at the end. The syringe is loaded with liquid epoxy resin. Good results have been obtained with Epo-tek type 301-2 manufactured by Epoxy Technology Inc. whose address is 14 Fortune Drive, Billerica, Mass. 01821. The syringe is compressed to produce a small bead 460' of epoxy at the end of the needle. The needle is positioned to just touch the side of the gap 116 with bead 460', as illustrated in FIG. 7d. The low-viscosity Epo-tek 301-2 rapidly wicks into the gap. The procedure is repeated on the other side of the gap. The assembly is then cured for two hours at 70° C., with the assembly oriented with baseplate 440 above the imager chips.

Figure 8:
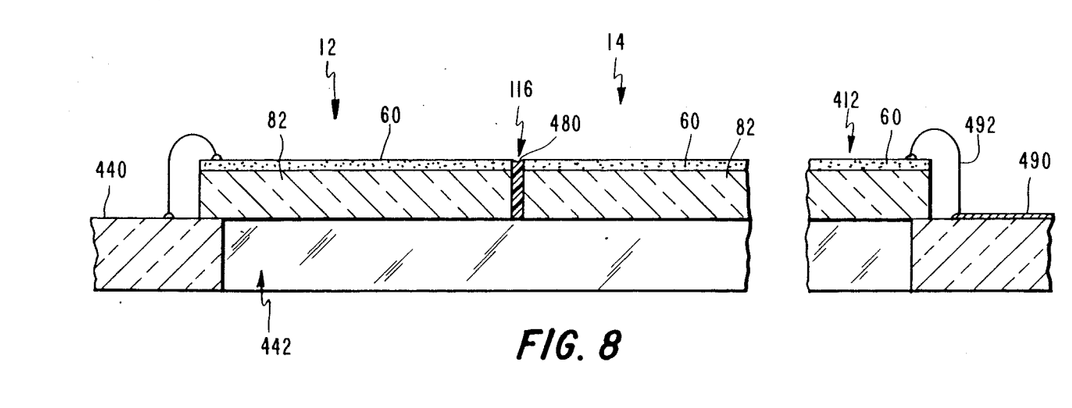
FIG. 8 is an elevation cross-section of a compound imager illustrating imager submodules and a filled gap.

FIG. 8 is similar to FIG. 7c, but illustrates the cured epoxy 480 in gap 116, and also illustrates how connections may be made to the imager chips. Elements of FIG. 8 corresponding to those of FIGS. 1–3 and 7 are designated by the same reference numerals. In FIG. 8, a surface metallization 490 is formed on the upper side of baseplate 440, a bond wire 492 is bonded to metallization 490 and to a bonding pad (not illustrated) on the upper surface of substrate 60 of imager 412.

Other embodiments of the invention will be apparent to those skilled in the art. For example, instead of the glass support used for imaging visible light and near-infrared, a support made from silicon (Si), Germanium (Ge) or other suitably transmissive materials may be used for electromagnetic radiation in the infrared or other bands. The coaxial line arrays of sensors may be parts of two-dimensional surface arrays of sensors. The index of refraction of the material filling the gap must be of course a substantial match to the adjacent material, as for example it must have an index of refraction of about 3.45 for use with silicon support plates. While the hardenable liquid has been described as an epoxy resin, it is expected that other materials such as silicones and polyimides, which harden into a solid form such as a gel or an elastomer, will also be suitable for gap filling. While single line arrays have been described, the invention is equally applicable to two-dimensional arrays of sensors, organized in the form of side-by-side line arrays. Chips with two-dimensional sensor arrays may be butted together on as many as all four edges.

What is claimed is:

1. A compound imager comprising separate first and second imager submodules, each of said imager submodules including a plate of electromagnetically transparent material having a first index of refraction and defining first and second mutually parallel broad surfaces, and also defining at least a third substantially flat surface orthogonal to said first and second broad surfaces, each of said imager submodules also including a line array of electromagnetic sensors responsive to electromagnetic radiation for producing signal, said line array of sensors of each of said submodules being mounted on said first broad surface and extending thereon substantially to said other surface, said first imager submodule having its third surface contiguous with said third surface of said second imager submodule in such a manner that said line array of sensors of said first submodule is substantially in line with said line array of sensors of said second submodule, whereby a gap may be defined at said contiguous third surfaces because of imperfections thereof, and said electromagnetic radiation illuminating said sensors may cause distortion in the response of sensors near said gap, said compound imager further comprising one of a solid and a liquid substance substantially completely filling said gap, said substance having an index of refraction near said first index of refraction.

2. An imager according to claim 1 wherein said substance is an epoxy resin which is initially in a liquid form for filling said gap and which then hardens into a solid.

3. An imager according to claim 2 wherein said glass is a pyrex material having a index of refraction of about 1.51, and said epoxy resin is Epo-tek type 301-2.

4. A method for improving the performance of an compound imager comprising separate first and second imager submodules, each of said imager submodules including a plate of electromagnetically transparent material having a first index of refraction first and second mutually parallel broad surfaces and at least substantially flat third surface orthogonal to said first and second broad surfaces, each of said imager submodules also including a line array of electromagnetic sensors responsive to electromagnetic radiation for producing signal, said line array of sensors of each of said submodules being mounted on said first broad surface and extending thereon substantially to said other surface, said first imager submodule having said third surface butted against said third surface of said second imager submodule in such a manner that said line array of said first submodule is substantially in line with said line array of said second submodule, whereby a gap may be defined at said butted third surfaces because of imperfections thereof, and said electromagnetic radiation illuminating said sensors may cause at least one of vignetting and crosstalk among sensors near said gap, comprising the steps of:

filling a hypodermic syringe with a hardenable liquid;

compressing the plunger of said syringe to form a bead of said hardenable liquid at the end of the needle of said syringe;

positioning said needle so said bead just touches a first side of said gap, whereby said hardenable liquid wicks into said gap;

repeating said compressing and positioning steps for a second side of said gap; and     curing said hardenable liquid into a solid form.

5. A method according to claim 4 further comprising, before said curing step, the step of:

orienting said imager with said second broad side up.

6. A method according to claim 4 wherein said curing step comprises the step of:

maintaining said imager at a predetermined temperature for a predetermined time.

7. A method according to claim 6 wherein, for an imager in which said first image of refraction is about 1.51 and said hardenable liquid is Epo-tek, 301-2 epoxy, said predetermined temperature is 70° C., and said time is two hours.

8. A method according to claim 4 wherein said curing step causes said liquid to be hardened into a solid form.

9. A method according to claim 4 wherein said curing step causes said liquid to be hardened into an elastomer.

* * * * *